(12) United States Patent
Kandaka et al.

(10) Patent No.: US 6,590,959 B2
(45) Date of Patent: Jul. 8, 2003

(54) HIGH-INTENSITY SOURCES OF SHORT-WAVELENGTH ELECTROMAGNETIC RADIATION FOR MICROLITHOGRAPHY AND OTHER USES

(75) Inventors: Noriaki Kandaka, Kawasaki (JP); Hideki Komatsuda, Ageo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/887,983

(22) Filed: Jun. 21, 2001

(65) Prior Publication Data

US 2001/0055364 A1 Dec. 27, 2001

(30) Foreign Application Priority Data

Jun. 23, 2000 (JP) ........................................ 2000-188994

(51) Int. Cl.⁷ ................................................ G21G 4/00
(52) U.S. Cl. ......................................... 378/119; 378/34
(58) Field of Search ........................ 378/34, 119, 121, 378/143, 145, 84, 85; 315/111.01, 111.11, 111.21; 313/359.1, 360.1, 361.1, 362.1

(56) References Cited

U.S. PATENT DOCUMENTS

| | | | | |
|---|---|---|---|---|
| 4,042,848 A | * | 8/1977 | Lee | 376/145 |
| 4,635,282 A | * | 1/1987 | Okada et al. | 378/34 |
| 5,517,314 A | * | 5/1996 | Wallin | 356/437 |
| 5,763,930 A | * | 6/1998 | Partlo | 250/504 R |
| 6,051,841 A | * | 4/2000 | Partlo | 250/504 R |
| 6,285,743 B1 | * | 9/2001 | Kondo et al. | 378/119 |
| 6,339,634 B1 | * | 1/2002 | Kandaka et al. | 378/119 |

FOREIGN PATENT DOCUMENTS

| | | |
|---|---|---|
| EP | 0 939 341 | 9/1999 |
| JP | 10-319195 | 12/1998 |
| JP | 11-312638 | 11/1999 |

* cited by examiner

*Primary Examiner*—Drew A. Dunn
*Assistant Examiner*—Courtney Thomas
(74) *Attorney, Agent, or Firm*—Klarquist Sparkman LLP (57) ABSTRACT

Sources are disclosed for producing short-wavelength electromagnetic radiation (EMR) such as extreme ultraviolet ("EUV" or "soft X-ray") radiation useful in microlithography. The sources collect a greater amount of the EMR produced by a plasma than conventional sources and form the collected EMR into an illumination EMR flux having higher intensity than conventionally. The EMR flux desirably has a rotationally symmetrical intensity distribution. The plasma is produced by two electrodes contained in a vacuum chamber. A high-voltage pulsed power supply applies a plasma-creating potential across the electrodes. EMR produced by the plasma is collected, typically by a reflective element configured to form a collimated beam of EMR. The electrodes are configured and oriented such that, as the collimated beam passes by the electrodes, the electrodes exhibit minimal blocking of the EMR flux. The electrodes can include a center electrode and a surrounding hollow cylindrical electrode separated from the center electrode by an insulating member. The axis of rotational symmetry of the electrodes desirably is substantially parallel to the propagation axis of the EMR flux.

28 Claims, 7 Drawing Sheets

HIGH-INTENSITY SOURCES OF SHORT-WAVELENGTH ELECTROMAGNETIC RADIATION FOR MICROLITHOGRAPHY AND OTHER USES

FIELD OF THE INVENTION

The present invention relates to sources of electromagnetic radiation (EMR) that can produce EMR in the extreme ultraviolet (soft X-ray) range of the electromagnetic spectrum. EMR from such a source can be used for microlithography, which is a key technique used in the manufacture of microelectronic devices such as integrated circuits, displays, and the like.

BACKGROUND OF THE INVENTION

As noted above, a key technique in the manufacture of microelectronic devices such as integrated circuits is microlithography. Most conventional microlithography is performed using deep ultraviolet (DUV) light. The pattern to be transferred is defined on a reticle or mask that is illuminated by a beam of DUV light. A downstream image of the illuminated portion of the reticle is projected (usually with demagnification) by a beam of DUV light onto a suitable substrate (e.g., semiconductor wafer) coated with a resist that is "sensitive" to exposure by the DUV light. Microlithography performed using DUV light still is within the realm of "optical microlithography."

With ever-increasing miniaturization and density of microelectronic devices, the need has become acute for a microlithography method offering greater resolution than optical microlithography. In fact, optical microlithography now is being conducted at or very nearly at the diffraction limit of DUV light, which means that substantially greater resolution than currently obtainable is probably not possible with optical microlithography. As a result of this dilemma, considerable research and development effort currently is underway to develop a practical "next generation" microlithography apparatus. Among top contenders are charged-particle-beam microlithography and "extreme ultraviolet" (also termed "EUV" or "soft X-ray") microlithography. The EUV wavelength range receiving the most current attention is 11 to 13 nm.

Unfortunately, EUV light and EMR of neighboring wavelengths are strongly absorbed by most known substances, and no optical materials are currently known that are transmissive to such EMR. Hence, with such EMR as used for microlithography, there is no known way in which to provide a refracting system that can be used for reticle illumination and/or projection of an image onto a substrate. Consequently, illumination-optical systems and projection-optical systems for use in microlithography performed using these short-wavelength EMRs must be made of reflecting optical elements.

Another difficulty with EUV radiation and related short-wavelength EMR is that reflectance of such radiation from ordinary reflective mirrors is extremely low. To obtain maximal reflectance, the mirrors are configured with reflecting surfaces made of a multilayer-film structure. For example, EUV-reflective mirrors have been produced with multilayer reflective films of molybdenum (Mo) and silicon (Si) for reflecting 13-nm EUV light, and multilayer reflective films of Mo and beryllium (Be) for reflecting 11-nm EUV light. However, even with the most efficient mirrors of these types, reflectance of EUV light is at most about 70%. The resulting loss of EMR at each mirror in the illumination-optical system and projection-optical system has led to considerable difficulty in achieving satisfactory imaging performance and throughput.

EUV radiation used in the technologies summarized above typically is produced from a highly specialized source such as an undulator, a laser-plasma source, or a discharge-plasma source. The latter two are attractive because of their relatively small size. In a laser-plasma source, a high-intensity pulsed laser light is converged on a target material to cause the target material to produce a high-temperature plasma from which EUV radiation is emitted. In a discharge-plasma source, the plasma is produced by electrical discharge between electrodes.

An exemplary plasma-focused source (a type of discharge-plasma source) is disclosed in Japan Kôkai Patent document no. Hei 10-319195 and shown in FIG. 8. The source includes an anode 1, a cathode 2, and a base member 3 situated inside a vacuum chamber 8. The electrodes 1, 2 are connected to and energized by high-voltage pulses produced by a pulse generator 7. A working-gas mixture (consisting of a buffer gas and a working gas that produces a desired transition when exposed to an electrical discharge) is introduced into the vacuum chamber 8 via a conduit 10. Specifically, the working-gas mixture is introduced by the conduit 10 to a space above the base member 3 and between the anode 1 and cathode 2. The cathode 2 surrounds the anode 1 in the manner of a cylinder. High-voltage pulses from the high-voltage pulse generator 7 are applied across the electrodes 1, 2 to create a discharge between the electrodes 1, 2. The discharge begins on the surface of the base member 3 and produces an "initial" plasma. The initial plasma is formed by ionization of the working gas in the region between the electrodes 1, 2 and above the base member 3.

Figure 8:
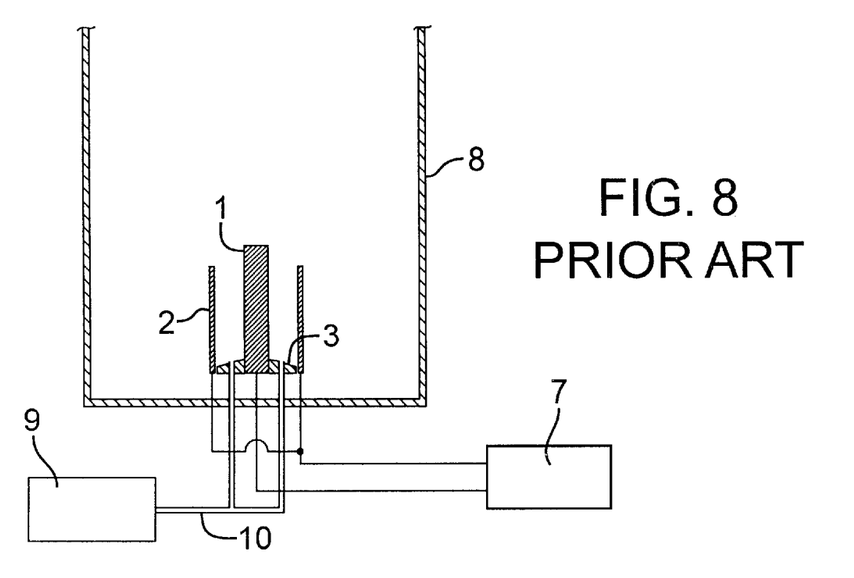
FIG. 8 is an elevational view of a conventional dense-plasma-focus (DPF) EMR source as disclosed in Japan Kôkai Patent Document No. Hei 10-319195.

Upon creation of the initial plasma, electrons and ions in the initial plasma move relative to each other under the influence of the electric-field produced by the voltage gradient between the electrodes 1, 2, thereby forming a current in the plasma. The current in the plasma, in turn, generates a magnetic field in the plasma. The ions and electrons moving through the plasma interact with the magnetic field and move upward. As a result, the plasma becomes concentrated at the distal end of the anode 1. The concentrated plasma has elevated temperature and density, sufficient to produce EUV light that radiates from the plasma.

In these sources, the material that actually forms the plasma is material situated at the electrode member excited by the concentrated plasma. Typically, the material includes not only the electrode member itself but also molecules of the working gas situated in the immediate vicinity of the electrode. The wavelength of EMR produced by the plasma corresponds to specific transitions in ions of the electrode member and of the working gas. The plasma region in which the desired EMR is produced is situated substantially within a volume having a diameter of about 1 mm at the distal tip of the electrode 1. Because plasma production is pulsatile, release of radiation from the plasma is pulsatile. Each pulse of released EMR has a duration in the range of about 0.1 μs to 1 μs. By way of example, if the working-gas mixture surrounding the distal end of the electrode 1 contains lithium vapor, then the resulting line spectrum of the produced EUV radiation is about 13.5 nm, which is attributable to the transition in the lithium ions in the plasma.

The amount of EMR produced per pulse by the plasma-focused source of FIG. 8 is greater than from a laser-plasma light source. Also, with this plasma-focused source, EMR can be produced having a relatively high pulse rate, e.g., of up to several kilohertz. Increasing the pulse rate yields an increase in the net amount of EMR that can be obtained from the source and allows the amount of radiation produced per unit time from the source to be controlled with higher precision.

Figure 9:
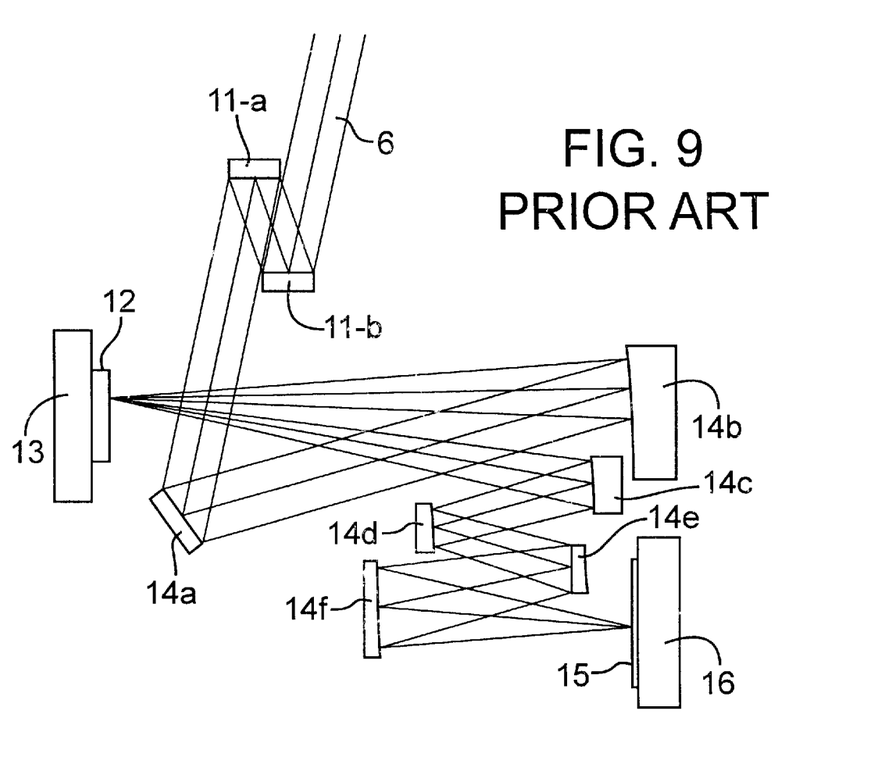
FIG. 9 is an optical diagram of portions of the illumination-optical and projection-optical systems of a conventional EUV microlithography apparatus as disclosed in Japan Kôkai Patent Document No. Hei 11-312638.
Figure 10A:
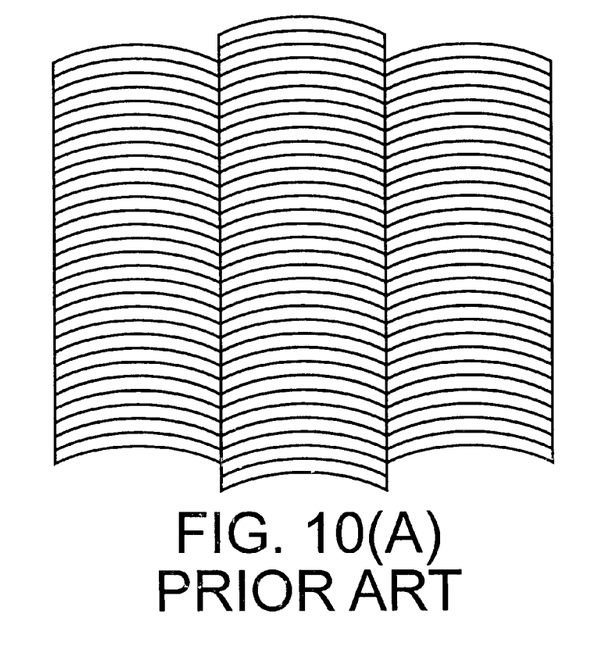
FIGS. 10(A)–10(B) are plan views of respective configurations of fly-eye mirrors used in the illumination-optical system of a conventional EUV microlithography apparatus, as disclosed in Japan Kôkai Patent Document No. Hei 11-312638.
Figure 10B:
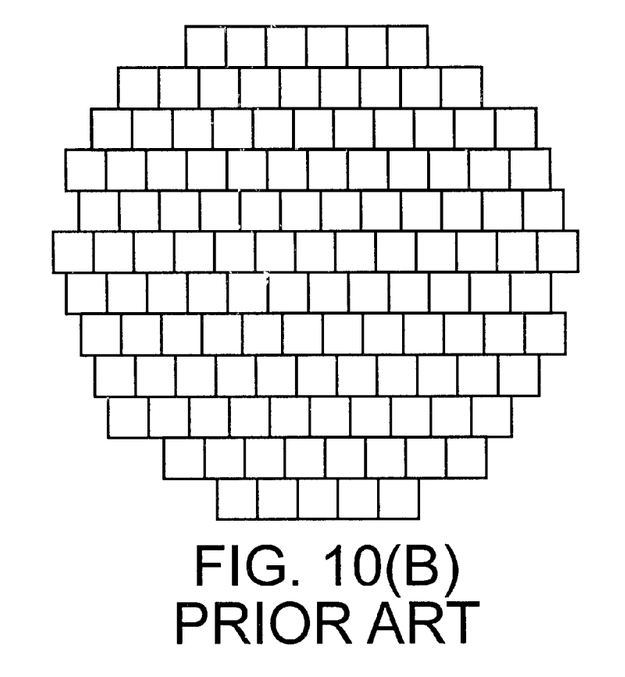

Japan Kôkai Patent Document No. Hei 11-312638 discloses use of an EUV light source, as described above, in an EUV microlithography apparatus. The optical system downstream of the source is depicted in FIG. 9 herein, wherein the rays 6 are propagating from the source. The optical elements 11a and 11b are "fly-eye" (compound) mirrors having respective surfaces such as shown in FIGS. 10(A) or FIG. 10(B). Upstream of the mirrors 11a, 11b are other mirrors that collect and collimate the EUV radiation produced by the source. Further with respect to FIG. 9, item 12 is a reflective reticle, item 13 is a reticle stage, items 14a–14f are mirrors, item 15 is the substrate, and item 16 is a wafer stage. The mirrors 14a, 14b, along with the mirrors 11a, 11b and mirrors situated between the mirror 11b and the source, constitute the "illumination-optical system." The mirrors 14c–14f constitute the "projection-optical system" that projects a reduced (demagnified) image of the illuminated portion of the reticle 12 onto the substrate 15.

The maximal achievable reflectance of each of the multilayer mirrors used in the illumination and projection systems is about 70%. In other words, at least about 30% of incident EMR on each mirror is lost. Consequently, after reflection from multiple mirrors to produce the demagnified images at the substrate 15, the maximal amount of EMR initially produced that actually participates in making an exposure on the substrate 15 is only a few percent. Since throughput is a function of the intensity of exposure light, to obtain more rapid exposure and correspondingly improved throughput, every bit of the EMR generated from the source must be gathered and utilized for exposure.

With an illumination-optical system configured as shown in FIG. 9, the respective areas of the reticle 12 and substrate 15 undergoing illumination and imaging, respectively, receive uniform illumination intensity. This is due in part to the uniformizing effects of the mirrors 11a, 11b (FIGS. 10(A) and 10(B)). As a result, imaging performance tends to be independent of the position or direction of the elements of the pattern being projected from the reticle 12 to the substrate 15. For even better imaging performance, it is desirable that the intensity of the EMR flux incident on the mirror 11b have a rotationally symmetrical (relative to the optical axis) distribution of intensity.

However, whenever a plasma-focused light source such as shown in FIG. 8 is used as a source of short-wavelength EMR, substantial limitations are imposed on the configuration of the illumination-optical system. As a result, it is very difficult to form an EMR flux, for illumination purposes, having a rotationally symmetrical intensity distribution with respect to the optical axis. I.e., from a plasma-focused source, the generated EMR propagates radially outward from the plasma. To be useful for microlithographic illumination purposes, the EMR flux 6 from the source must be collimated, as shown in FIG. 9. One possible way in which the EMR from the source can be collimated is to place a mirror, configured as a paraboloid of revolution having a focal point, relative to the source such that the EMR-producing plasma is at the focal point of the mirror. Hence, EMR produced by the plasma reflects from the mirror as a collimated beam. Unfortunately, in conventional configurations of this nature that have been considered to date, the electrodes of the plasma-focused source undesirably block propagation of some of the EMR reflected from the mirror. This blocking limits the solid angle at which the EMR can be utilized from the source and used to form the collimated beam.

Therefore, there is a need for improved devices and methods for forming a collimated flux of short-wavelength EMR, for illumination purposes, from a plasma-focused light source, wherein the amount of EMR not utilized from the source (due to blockage by electrodes) is reduced compared to conventional sources, and wherein the produced EMR flux has a rotationally symmetrical distribution of intensity. There also is a need for microlithography apparatus and methods including use of such improved sources.

SUMMARY OF THE INVENTION

In view of the foregoing, and according to a first aspect of the invention, devices are provided for generating a flux of electromagnetic radiation (EMR). An embodiment of such a device comprises a vacuum chamber, first and second electrodes located within the vacuum chamber, an insulating member, and an EMR-flux collimator. The first electrode has an axis of rotational symmetry. The second electrode is situated coaxially with but spaced apart from the first electrode. The first and second electrodes are connectable to a power supply configured to apply a high-voltage pulse across the first and second electrodes so as to generate an EMR-producing plasma adjacent the distal end of the first electrode. The insulating member is attached to the respective proximal ends of and extending between the first and second electrodes so as to support the first electrode relative to the second electrode. The EMR-flux collimator is situated in the vacuum chamber relative to the first and second electrodes such that EMR produced by the plasma is collected and collimated by the EMR-flux collimator to produce a collimated EMR flux. The EMR-flux collimator is situated and configured to direct the collimated EMR flux along a propagation axis, extending parallel to the axis of rotational symmetry of the first electrode, past the first and second electrodes.

The device can include a power supply connected to the first and second electrodes and configured to apply high-voltage pulses across the first and second electrodes so as to generate an EMR-producing plasma adjacent the distal end of the first electrode.

The EMR-flux collimator can include an EMR-reflective element. The EMR-reflective element desirably is a concave mirror having an EMR-reflective surface configured as a paraboloid of revolution about a mirror axis. The mirror axis desirably is parallel to the propagation axis, more desirably the mirror axis extends along the axis of rotational symmetry.

The second electrode can be a unitary cylindrical electrode surrounding the first electrode. Alternatively, the second electrode comprises multiple electrode portions commonly connectable to the power supply and collectively surrounding the first electrode about the axis of rotational symmetry. The first electrode can be, for example, a solid or hollow cylinder in conformation.

The insulating member desirably is configured with spokes or mesh extending between the proximal ends of the first and second electrodes. The spokes desirably extend radially from the proximal end of the first electrode to the proximal end of the second electrode. In any event, the insulating presents a minimal obstacle to the EMR flux propagating past the electrodes from the EMR-flux collimator.

The EMR-flux-generating device also can include a supply of a gas comprising a working gas. The gas supply is connected to the vacuum chamber so as to supply the gas between the first and second electrodes and thus allow the working gas to become ionized in the plasma sufficient to contribute to the EMR flux produced by the plasma. The working gas can be formulated so that the plasma produces EMR including EUV radiation.

According to another embodiment, a device for generating a flux of electromagnetic radiation (EMR) comprises a vacuum chamber, first and second electrodes located in the vacuum chamber, and an EMR-flux former. The first electrode has an axis of rotational symmetry as summarized above. The second electrode has an inner wall that is separated from and in coaxial radial symmetry with the first electrode. The first and second electrodes are connectable to a power supply configured to apply a high-voltage pulse across the first and second electrodes so as to generate an EMR-producing plasma adjacent the distal end of the first electrode. The inner wall of the second electrode has at least a region thereof comprising a multilayer film that is reflective to the EMR. The EMR-flux former is situated in the vacuum chamber relative to the first and second electrodes, and is situated and configured to collect and reflect EMR, from the plasma, into an EMR flux propagating along a propagation axis past the first and second electrodes.

As summarized above, the second electrode can be a unitary cylindrical electrode surrounding the first electrode, or can comprise multiple electrode portions collectively surrounding the first electrode about the axis of symmetry. In the latter instance, each electrode portion comprises a respective inner wall that comprises a respective portion of the inner wall of the second electrode. Similarly, the first electrode can be a solid or hollow cylinder in conformation.

The region of the second electrode comprising the EMR-reflective multilayer film can be configured as a paraboloid of revolution, a spheroid of revolution, an ellipsoid of revolution, or a hyperboloid of revolution about the axis of rotational symmetry. In any of such configurations, the region comprising the EMR-reflective multilayer film has a focal point situated adjacent the distal end of the first electrode where the EMR-producing plasma is located.

The region of the second electrode comprising the EMR-reflective multilayer film can be configured as a concave reflective surface having a focal point situated adjacent the distal end of the first electrode where the EMR-producing plasma is located. In this configuration, the concave reflective surface is situated to reflect EMR from the plasma to the EMR-flux former. The concave reflective device can be situated to reflect EMR from the plasma back to the plasma and then to the EMR-flux former. In such a configuration, the EMR-flux former can comprise a concave mirror having an EMR-reflective surface configured as a paraboloid of revolution about a mirror axis, wherein the mirror axis extends along the axis of rotational symmetry. The EMR-reflective surface can be configured to form, by reflection, the EMR flux that propagates along the mirror axis past the electrodes.

The region of the second electrode comprising the EMR-reflective multilayer film can be configured as a concave reflective surface having a focal point situated adjacent the distal end of the first electrode where the EMR-producing plasma is located. In this configuration, the concave reflective surface is situated to reflect EMR from the plasma axially past the first and second electrodes.

According to another aspect of the invention, microlithography apparatus are provided that include a device, such as any of the embodiments summarized above, for generating an EMR flux. Such an apparatus also includes an illumination-optical system situated and configured to illuminate a reticle with an EMR flux produced by the device, wherein the reticle defines a pattern to be transferred to a sensitive substrate. The apparatus also includes a projection-optical system situated downstream of the illumination-optical system and configured to transfer the pattern from the reticle to the sensitive substrate.

The foregoing and additional features and advantages of the invention will be more readily apparent from the following detailed description, which proceeds with reference to the accompanying drawings.

DETAILED DESCRIPTION

The invention is described below in the context of representative embodiments that are not to be regarded as limiting in any way.

Figure 1:
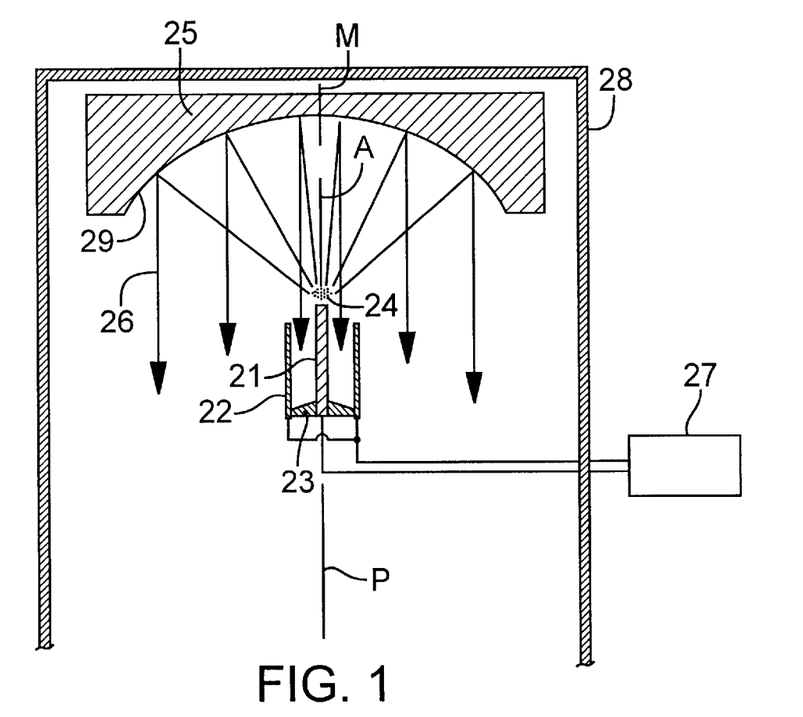
FIG. 1 is an elevational view of an electromagnetic radiation (EMR) source according to a first representative embodiment of the invention.

A first representative embodiment of an electromagnetic radiation (EMR) source according to the invention is depicted in FIG. 1. This embodiment is configured as a dense-plasma-focused (DPF) source that can be used as a source of EUV light for use in, e.g., the illumination-optical system of an EUV microlithography apparatus (see FIG. 9). In the configuration of FIG. 1 a center electrode 21 (made of, e.g., tungsten if the source is to be used to generate EUV light) is situated in a vacuum chamber 28 that can be evacuated, during operation, to a pressure of 10 Pa or less. The center electrode 21 desirably is configured as an axially extended member situated on an axis A of rotational symmetry. For example, the center electrode 21 can be configured as a solid or hollow cylinder. The center electrode 21 is surrounded by a coaxial "hollow" electrode 22 that is desirably cylindrical in configuration. In this embodiment, the center electrode 21 is the anode and the cylindrical electrode 22 is the cathode. The electrodes 21, 22 are positioned relative to each other by an insulating member 23, described further below.

Although the cylindrical electrode 22 is depicted in the figure as a single electrode, it alternatively may be configured as a plurality of electrode portions collectively surrounding the center electrode 21 in the general manner shown. In such a configuration, each electrode portion contributes its respective share to surrounding the center electrode 21 about the axis A. Whenever the cylindrical electrode 22 is configured with multiple electrode portions, all the portions typically are energized with the same electrical potential and polarity. It also is possible for the center electrode 21 to comprise multiple electrode portions each contributing its respective share to the overall configuration of the center electrode 21. However, the center electrode 21 usually consists of only one electrode member (as shown) since the plasma 24 is concentrated at the distal end of the center electrode 21.

During plasma generation, to generate EMR within the EUV band, a mixed gas of helium and lithium vapor (serving as the working gas) is introduced into the vacuum chamber 28 through a gas-supply conduit (not shown, but well understood in the art; see FIG. 8). A high-voltage pulse power supply 27 is connectable to the electrodes 21, 22. The power supply 27 is configured to apply a pulsed (e.g., 1 kHz) potential (e.g., 1 kV) across the electrodes 21, 22. In any event, the potential applied across the electrodes 21, 22 results in production of a concentrated plasma 24 of high temperature and density at the distal end of the center electrode 21. Molecules of the working gas are drawn into the concentrated plasma. If the working gas includes lithium vapor, then the concentrated plasma produces EMR of a wavelength (about 13.5 nm) suitable for EUV microlithography.

The configuration of FIG. 1 includes, as a representative "EMR-flux collimator," a concave mirror 25 of which the concave reflective surface is configured as a paraboloid of revolution (about a respective mirror axis). So as to be reflective to the EMR produced by the plasma 24, the concave reflective surface of the mirror 25 includes a multilayer film 29 (too thin to detail in the figure, but having a configuration as summarized above in the "Background" section) that is especially configured to reflect the EMR produced by the plasma 24 (e.g., EUV radiation of 13.5 nm). The mirror 25 has a focal point, and the mirror 25 is positioned relative to the electrodes 21, 22 such that the concentrated plasma 24 is situated at the focal point of the mirror 25. Hence, EMR from the concentrated plasma 24 is reflected by the paraboloidal concave surface of the multilayer mirror 25 as a collimated beam (rays 26) of illumination EMR. As shown in FIG. 1, the collimated beam 26 propagates along a propagation axis P past the electrodes 21, 22.

The propagation axis P desirably is parallel to the axis A, and more desirably extends along the axis A. In the latter instance, the transverse section presented by the electrodes 21, 22 and insulating member 23 is rotationally symmetrical relative to the EMR flux and is as small as possible. Hence, more EMR flux in the collimated beam 26 is available for downstream illumination purposes, such as for EUV microlithography.

Figure 2A:
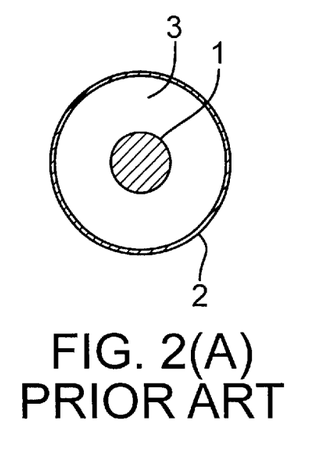
FIG. 2(A) is a plan view (along the axis) of the electrodes and insulating member of a conventional EMR source.
Figure 2B:
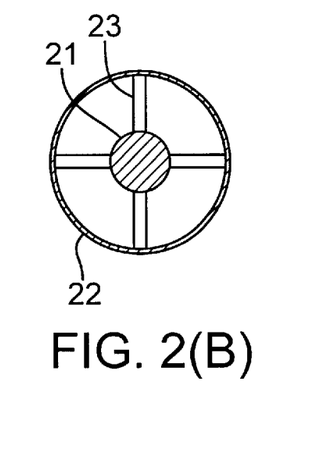
FIG. 2(B) is a plan view (along the axis) of the electrodes and insulating member of the EMR source of the embodiment shown in FIG. 1.

The EMR source of FIG. 1 is configured especially to prevent significant blocking of the collimated beam 26 by the electrodes 21, 22 and insulating member 23. To such end, as noted above, the electrodes 21, 22 are oriented such that their axis A is oriented parallel to (desirably oriented along) the propagation axis P of the collimated beam 26. According to another aspect of the configuration, the insulating member 23 (attached to the respective proximal ends of the electrodes 21, 22) has a spoked configuration, for example as shown in FIG. 2(B), wherein the spokes extend radially relative to the axis of the center electrode 21. This spoked configuration is compared with a conventional EUV source (FIG. 2(A)) in which the insulating member 3 extends across all the space between the center electrode 1 and the surrounding electrode 2. Hence, with the spoked configuration as shown in FIG. 2(B), the insulating member 23 and electrodes 21, 22 of the EMR source of this embodiment exhibit substantially reduced blocking of the collimated EMR flux reflected from the mirror 25, compared to the conventional configuration shown in FIG. 2(A).

Although the insulating member 23 in this embodiment is depicted in FIG. 2(B) as having a spoked configuration, the insulating member 23 alternatively can have any of various other configurations. For example, the insulating member 23 can have a meshed configuration or the like that imparts minimal blocking of the collimated EMR flux reflected from the mirror 25 and propagating past the electrodes 21, 22. In general, the insulating member 23 presents a surface area to the reflected collimated beam that is maximally reduced while still providing adequate support for the electrodes 21, 22 and while still serving as a situs for generating the initial plasma.

Figure 3:
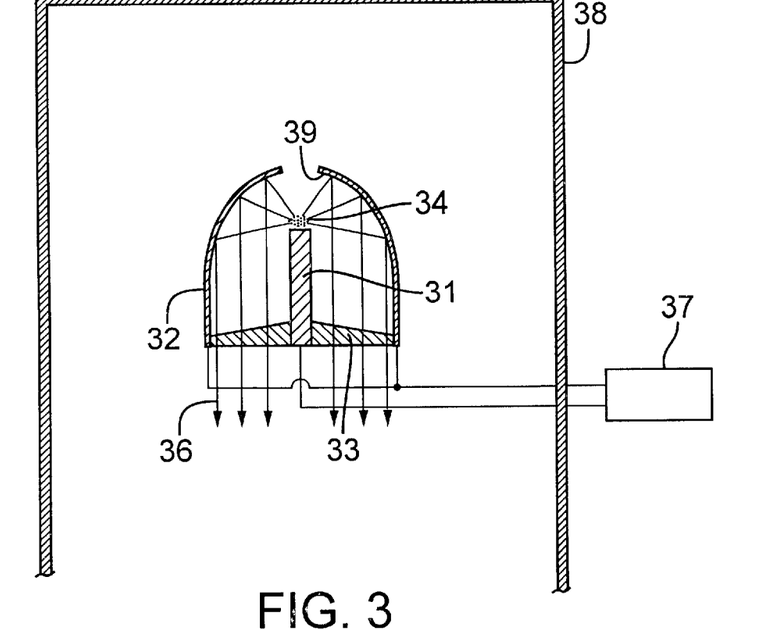
FIG. 3 is an elevational view of an EMR source according to a second representative embodiment of the invention.

A second representative embodiment of an EMR source according to the invention is depicted in FIG. 3. This embodiment is configured as a DPF source that can be used, for example, as an EUV source for an illumination-optical system of an EUV microlithography apparatus.

This embodiment comprises a center electrode 31 and surrounding electrode 32 spaced from the center electrode 31 by an insulating member 33 to which the proximal ends of the electrodes are attached. The electrodes 31, 32, and insulating member 33 are situated inside a vacuum chamber 38, and the electrodes 31, 32 are connectable to a pulse power supply 37 as described above. The center electrode 31 and insulating member 33 have substantially the same respective structures as the respective components 21, 23 in the first representative embodiment. However, the surrounding electrode 32 is configured differently in the instant embodiment. Specifically, the inner wall surface of the distal end of the surrounding electrode 32 is configured as a paraboloid of revolution having a focal point situated at the position of a concentrated plasma 34 produced adjacent the distal end of the center electrode 31. So as to be maximally reflective to the EMR produced by the concentrated plasma 34, the paraboloidal surface of the inside wall of the surrounding electrode comprises a multilayer film 39 configured to reflect the EMR produced by the concentrated plasma 34. The paraboloid of revolution is oriented such that EMR radiated from the plasma 34 reflects from the paraboloidal surface of the inside wall of the surrounding electrode 32 and thus forms the collimated EMR flux 36.

With a surrounding electrode 32 configured as shown in FIG. 3, EMR rays that conventionally are blocked by the surrounding electrode now are guided in directions allowing the rays to be collected into the collimated EMR flux 36 and used for downstream illumination purposes.

Figure 4:
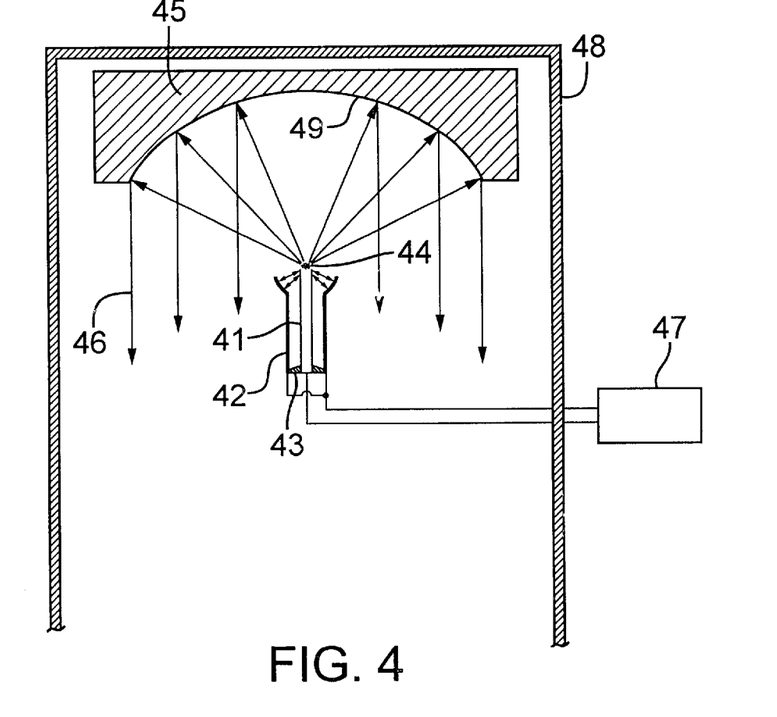
FIG. 4 is an elevational view of an EMR source according to a third representative embodiment of the invention.

A third representative embodiment of an EMR source according to the invention is depicted in FIG. 4. This embodiment is configured as a DPF source that can be used, for example, as an EUV source for an illumination-optical system of an EUV microlithography apparatus.

This embodiment comprises a center electrode 41 and surrounding electrode 42 spaced from the center electrode 41 by an insulating member 43. Similar to the first representative embodiment, the instant embodiment also includes a concave mirror 45 (with paraboloidal reflective surface) situated and configured in a manner similar to the paraboloidal mirror 25 in the first representative embodiment. The electrodes 41, 42, insulating member 43, and paraboloidal mirror 45 are situated inside a vacuum chamber 48, and the electrodes 41, 42 are connectable to a pulse power supply 47 as described above. The center electrode 41 and insulating member 43 have substantially the same respective structures as the respective components 21, 23 in the first representative embodiment. However, the surrounding electrode 42 is configured differently in the instant embodiment. Specifically, the distal end of the surrounding electrode 42 is configured as a spheroid having a center located at the concentrated plasma 44 produced adjacent the distal end of the center electrode 41. So as to be maximally reflective to EMR produced by the concentrated plasma 44, the inner surface (concave surface) of the spherical portion of the surrounding electrode 42 comprises a multilayer film 49 configured to reflect the EMR produced by the concentrated plasma 44. EMR produced by the plasma 44 and radiating downward (in the figure) reflects from the inner surface of the spheroid and propagates through the plasma 44 to the paraboloidal mirror 45. EMR produced by the plasma 44 and radiating upward (in the figure) reflects from the multilayer surficial film of the paraboloidal mirror 45 in the same manner as in the first representative embodiment. Substantially all EMR reflected from the multilayer surficial film of the paraboloidal mirror 45 comprises a collimated flux 46 of EMR that can be used for microlithographic illumination purposes.

Since the paraboloidal mirror 45 collects EMR propagating directly from the plasma 44, as well as EMR reflected from the concave spheroidal portion of the surrounding electrode 42, this embodiment is able to collect and utilize more of the EMR produced by the plasma 44 than the first representative embodiment.

The concave reflective surface of the mirror 45 need not be configured as a paraboloid of revolution. Alternatively, the concave reflective surface can have any of various other profiles that is rotationally symmetrical and that can function in concert with the distal end of the surrounding electrode 42 to produce the desired EMR flux 46.

Although the EMR-source embodiments are described above in the context of producing EUV light (as a representative EMR), it will be understood that the wavelength of light produced by any of these embodiments is not limited strictly to the EUV band of electromagnetic radiation. As noted above, the wavelength of EMR produced by these sources depends upon the composition of the working gas and/or the material of the center electrode. By changing one or more of these materials, it is possible to produce an EMR flux having a wavelength outside the EUV band, and the materials are selected according to the particular wavelength desired to be produced.

Figure 5:
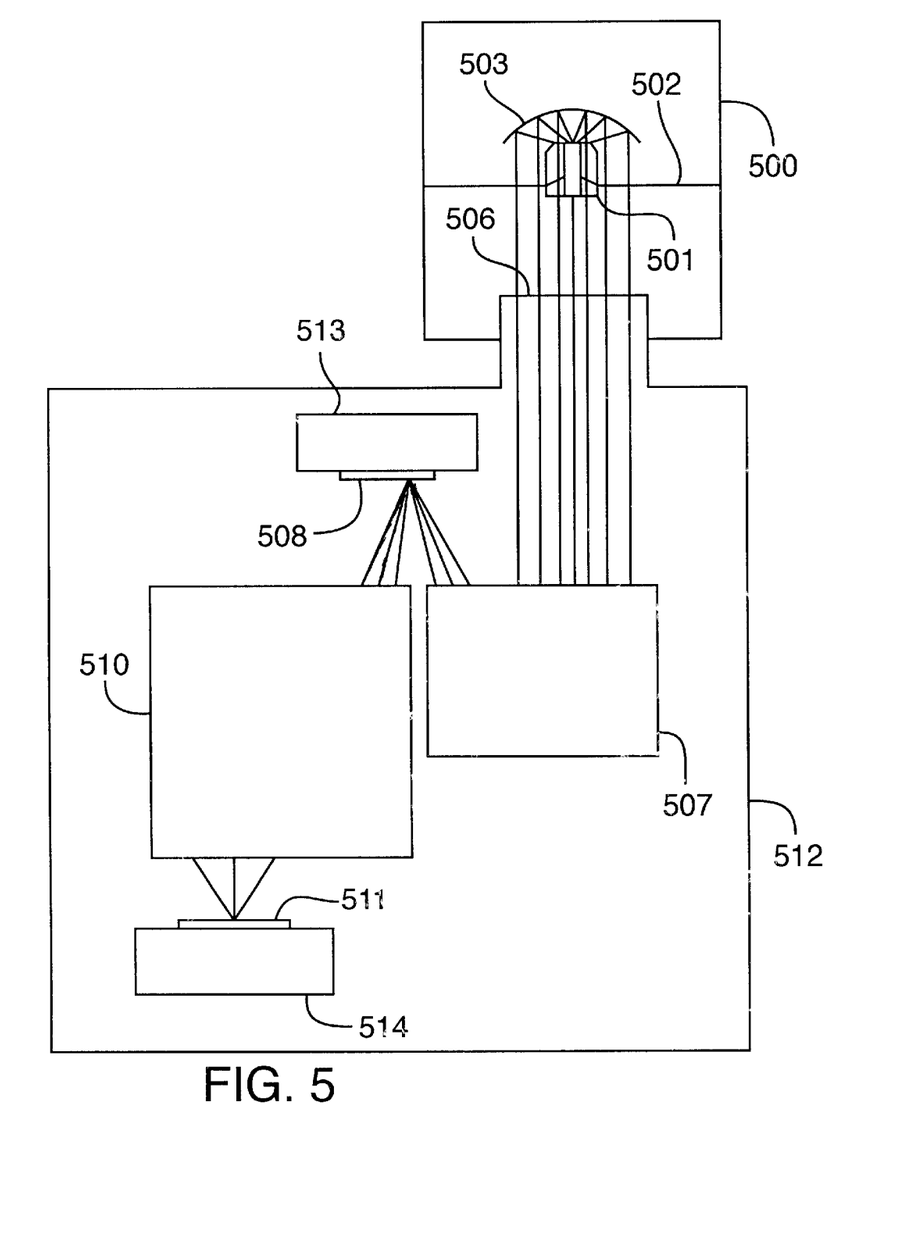
FIG. 5 is a simplified schematic diagram of an EUV microlithography apparatus according to the fourth representative embodiment of the invention.

FIG. 5 is a schematic diagram of a fourth representative embodiment of the invention, directed specifically to a "reduction" (demagnifying) EUV (soft X-ray) microlithograpy apparatus that includes an EMR source such as any of the embodiments described above. The apparatus of FIG. 5 can be used, e.g., for performing a lithography step in the wafer processing used to produce any of various microelectronic devices. For example, the embodiment shown in FIG. 5 utilizes the DPF EMR source of the first representative embodiment. Hence, for details of the EMR source not provided below, reference should be made to the discussion above pertaining to the first representative embodiment.

In the instant embodiment, the EMR source 501 comprises an anode electrode (center electrode) made of tungsten, and the target substance is lithium crystals. Hence, the EMR source 501 produces soft X-rays (EUV radiation) having a wavelength in the vicinity of 13 nm. The EMR source 501 is affixed inside a vacuum chamber 500 by a support column 502. The EMR source 501 includes a paraboloidal reflective mirror 503 for reflecting and collimating EUV radiation produced by the dense plasma. The concave reflective surface of the paraboloidal reflective mirror 503 includes a Mo/Si multilayer film suitable for reflecting EUV radiation of the desired wavelength band. I.e., the multilayer film is constructed of alternating layers of Mo and Si, and the period length of the Mo/Si multilayer structure is established so as to be maximally reflective to EUV radiation of about 13 nm. Hence, although the EMR produced by the source 501 may contain various wavelengths, only EUV radiation having a wavelength of about 13 nm is reflected from the concave surface of the paraboloidal mirror 503.

The collimated beam of EUV radiation reflected from the mirror 503 is transmitted through a filtering window 506 configured to block visible light. To such end, the filtering window 506 is made of, e.g., zirconium (Zr) with a thickness of 0.15 nm. The transmitted EUV radiation is incident on an illumination-optical system 507. The illumination-optical system 507 in this embodiment forms an illumination beam having an arc-shaped transverse section for illumination purposes. The illumination beam is incident on a reflecting reticle 508 that defines a pattern for a microelectronic device (e.g., a pattern for a layer in an integrated circuit). Thus, the illumination beam "illuminates" a region on the reticle 508. EUV radiation reflected from the reticle 508 is demagnified (e.g., by a factor of 4, yielding a demagnification factor of ¼) by passage through a projection-optical system 510. I.e., in this embodiment, the projection-optical system 510 produces a ¼-sized image of the illuminated portion of the reticle 508 on the surface of a substrate (e.g., silicon wafer) 511 coated with a suitable resist.

The reflecting reticle 508 and substrate 511 are mounted on a reticle stage 513 and wafer stage 514, respectively. Since only a portion of the reticle 508 is illuminated (by the arc-shaped illumination beam) at any one instant during exposure, the reticle 508 and substrate 511 must be moved as exposure proceeds to achieve exposure of the entire pattern. Hence, during exposure, the stages 513, 514 are moved relative to each other in a synchronous scanning manner to complete exposure of, for example, an integrated-circuit pattern measuring 25×25 mm on the substrate 511. An exemplary pattern resolution achievable with the apparatus of FIG. 5 is a line spacing of 0.07 µm.

It will be understood that the apparatus of FIG. 5 can employ, as an EMR source, any of the other embodiments described above. Any of the EMR sources according to the invention can be operated continuously for extended periods of time, thereby allowing, in a microlithographic context, microelectronic devices to be manufactured at high yield. In addition, because the EMR sources according to the invention collect and collimate a larger percentage of plasma-produced EMR than conventional EMR sources, throughput of any microelectronic-device-manufacturing process performed using a microlithography apparatus including an EMR source according to the invention exhibit higher throughput than corresponding conventional apparatus.

Figure 6:
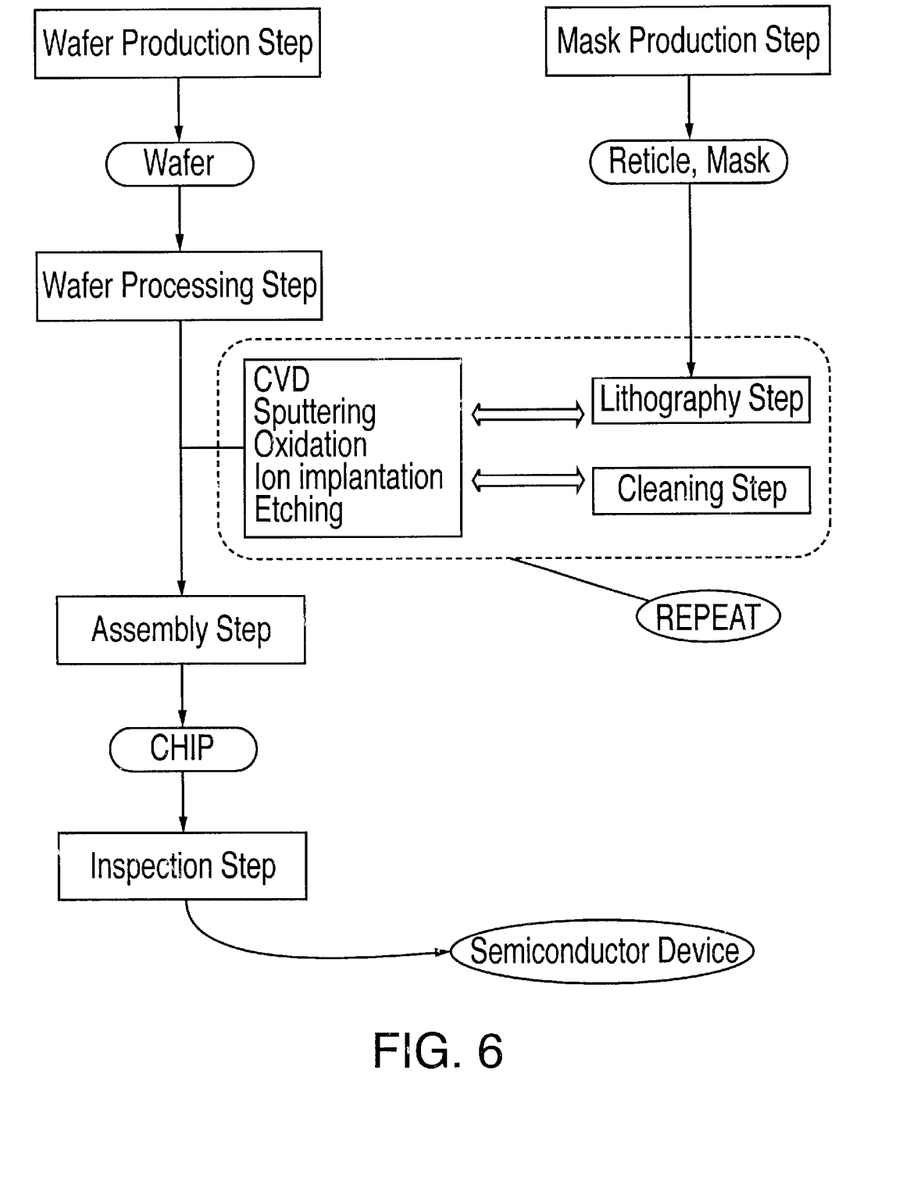
FIG. 6 is a flow chart of a microelectronic-device manufacturing process including use of an EUV microlithography apparatus according to the invention.

FIG. 6 is a flowchart of an exemplary microelectronic-fabrication method in which apparatus and methods according to the invention can be applied readily. The fabrication method generally comprises the main steps of wafer production (wafer manufacturing or preparation), reticle (mask) production or preparation; wafer processing, device (chip) assembly (including dicing of chips and rendering the chips operational), and device (chip) inspection. Each step usually comprises several sub-steps.

Among the main steps, wafer processing is key to achieving the smallest feature sizes (critical dimensions) and best inter-layer registration. In the wafer-processing step, multiple circuit patterns are layered successively atop one another on the wafer, forming multiple chips destined to be memory chips or main processing units (MPUs), for example. The formation of each layer typically involves multiple sub-steps. Usually, many operative microelectronic devices are produced on each wafer.

Typical wafer-processing steps include: (1) thin-film formation (by, e.g., sputtering or CVD) involving formation of a dielectric layer for electrical insulation or a metal layer for connecting wires or electrodes; (2) oxidation step to oxidize the substrate or the thin-film layer previously formed; (3) microlithography to form a resist pattern for selective processing of the thin film or the substrate itself; (4) etching or analogous step (e.g., dry-etching) to etch the thin film or substrate according to the resist pattern; (5) doping as required to implant ions or impurities into the thin film or substrate according to the resist pattern; (6) resist stripping to remove the remaining resist from the wafer; and (7) wafer inspection. Wafer processing is repeated as required (typically many times) to fabricate the desired microelectronic devices on the wafer.

Figure 7:
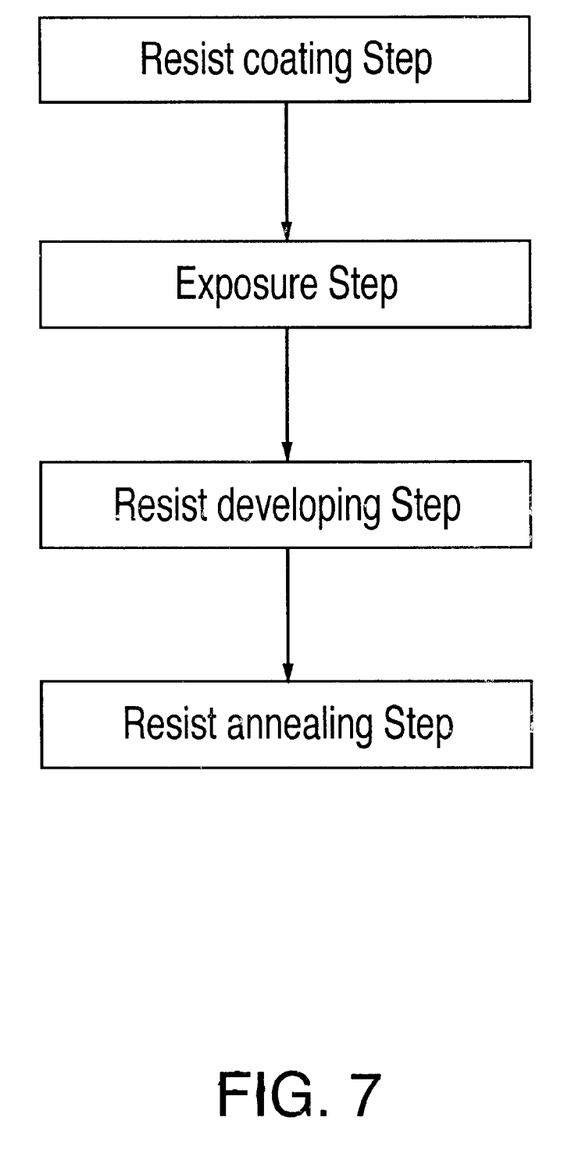
FIG. 7 is a flow chart of key steps in the microlithography step of the process of FIG. 6.

FIG. 7 provides a flowchart of typical steps performed in microlithography, which is a principal step in the wafer processing step shown in FIG. 6. The microlithography step typically includes: (1) resist-application step, wherein a suitable resist is coated on the wafer substrate (which an include a circuit element formed in a previous wafer-processing step); (2) exposure step, to expose the resist with the desired pattern by microlithography; (3) development step, to develop the exposed resist to produce the imprinted image; and (4) optional resist-annealing step, to enhance the durability of and stabilize the resist pattern.

The process steps summarized above are all well known and are not described further herein.

Whereas the invention has been described in connection with a representative embodiment, it will be understood that the invention is not limited to that embodiment. On the contrary, the invention is intended to encompass all modifications, alternatives, and equivalents as may be included within the spirit and scope of the invention, as defined by the appended claims.

What is claimed is:

1. A device for generating a flux of electromagnetic radiation (EMR), comprising:
   a vacuum chamber;
   a first electrode located within the vacuum chamber, the first electrode having an axis of rotational symmetry, a distal end, and a proximal end;
   a second electrode located within the vacuum chamber, the second electrode having a proximal end and being situated coaxially with but spaced apart from the first electrode, the first and second electrodes being connectable to a power supply configured to apply a high-voltage pulse across the first and second electrodes so as to generate an EMR-producing plasma adjacent the distal end of the first electrode;
   an insulating member attached to the respective proximal ends of and extending between the first and second electrodes so as to support the first electrode relative to the second electrode; and
   an EMR-flux collimator situated in the vacuum chamber relative to the first and second electrodes such that EMR produced by the plasma is collected and collimated by the EMR-flux collimator to produce a collimated EMR flux, the EMR-flux collimator being situated and configured to direct the collimated EMR flux along a propagation axis, extending parallel to the axis of rotational symmetry of the first electrode, past the first and second electrodes.

2. The device of claim 1, further comprising a power supply connected to the first and second electrodes and configured to apply high-voltage pulses across the first and second electrodes so as to generate an EMR-producing plasma adjacent the distal end of the first electrode.

3. The device of claim 1, wherein the EMR-flux collimator comprises an EMR-reflective element.

4. The device of claim 3, wherein the EMR-reflective element is a concave mirror having an EMR-reflective surface configured as a paraboloid of revolution about a mirror axis.

5. The device of claim 4, wherein the mirror axis is parallel to the propagation axis.

6. The device of claim 5, wherein the mirror axis extends along the axis of rotational symmetry.

7. The device of claim 1, wherein the second electrode is a unitary cylindrical electrode surrounding the first electrode.

8. The device of claim 1, wherein the second electrode comprises multiple electrode portions commonly connectable to the power supply and collectively surrounding the first electrode about the axis of rotational symmetry.

9. The device of claim 1, wherein the first electrode is a solid or hollow cylinder in conformation.

10. The device of claim 1, wherein the propagation axis extends along the axis of rotational symmetry.

11. The device of claim 1, wherein the insulating member is configured with spokes or mesh extending between the proximal ends of the first and second electrodes.

12. The device of claim 11, wherein the spokes extend radially from the proximal end of the first electrode to the proximal end of the second electrode.

13. The device of claim 1, further comprising a supply of a gas comprising a working gas, the gas supply being connected to the vacuum chamber so as to supply the gas between the first and second electrodes and thus allow the working gas to become ionized in the plasma sufficient to contribute to the EMR flux produced by the plasma.

14. The device of claim 13, wherein the working gas is appropriate to cause the plasma to produce EMR including EUV radiation.

15. A microlithography apparatus, comprising:
   a device for generating an EMR flux as recited in claim 1;
   an illumination-optical system situated and configured to illuminate a reticle with an EMR flux produced by the device, the reticle defining a pattern to be transferred to a sensitive substrate; and
   a projection-optical system situated downstream of the illumination-optical system and configured to transfer the pattern from the reticle to the sensitive substrate.

16. A microelectronic-device manufacturing process, comprising:
  (a) preparing a substrate;
  (b) processing the substrate; and
  (c) assembling microelectronic devices formed on the substrate during steps (a) and (b), wherein step (b) comprises the steps of (i) applying a resist to the substrate; (ii) exposing the resist; and (iii) developing the resist; and step (ii) comprises providing a microlithography apparatus as recited in claim 15, and using the microlithography apparatus to expose the resist with the pattern defined on the reticle.

17. A device for generating a flux of electromagnetic radiation (EMR), comprising:
  a vacuum chamber;
  a first electrode located within the vacuum chamber and having an axis of rotational symmetry and a distal end;
  a second electrode located with the vacuum chamber relative to the first electrode, the second electrode having an inner wall that is separated from and in coaxial radial symmetry with the first electrode, the first and second electrodes being connectable to a power supply configured to apply a high-voltage pulse across the first and second electrodes so as to generate an EMR-producing plasma adjacent the distal end of the first electrode, the inner wall having at least a region thereof comprising a multilayer film that is reflective to the EMR; and
  an EMR-flux former situated in the vacuum chamber relative to the first and second electrodes, the EMR-flux former being situated and configured to collect and reflect EMR, from the plasma, into an EMR flux propagating along a propagation axis past the first and second electrodes.

18. The device of claim 17, wherein the second electrode is a unitary cylindrical electrode surrounding the first electrode.

19. The device of claim 17, wherein:
  the second electrode comprises multiple electrode portions collectively surrounding the first electrode about the axis of symmetry; and
  each electrode portion comprises a respective inner wall that comprises a respective portion of the inner wall of the second electrode.

20. The device of claim 17, wherein the first electrode is a solid or hollow cylinder in conformation.

21. The device of claim 17, wherein the propagation axis extends along the axis of rotational symmetry.

22. The device of claim 17, wherein:
  the region of the second electrode comprising the EMR-reflective multilayer film is configured as a paraboloid of revolution, a spheroid of revolution, an ellipsoid of revolution, or a hyperboloid of revolution about the axis of rotational symmetry; and
  the region comprising the EMR-reflective multilayer film has a focal point situated adjacent the distal end of the first electrode where the EMR-producing plasma is located.

23. The device of claim 17, wherein:
  the region of the second electrode comprising the EMR-reflective multilayer film is configured as a concave reflective surface having a focal point situated adjacent the distal end of the first electrode where the EMR-producing plasma is located; and
  the concave reflective surface is situated to reflect EMR from the plasma to the EMR-flux former.

24. The device of claim 23, wherein the concave reflective device is situated to reflect EMR from the plasma back to the plasma and then to the EMR-flux former.

25. The device of claim 24, wherein:
  the EMR-flux former comprises a concave mirror having an EMR-reflective surface configured as a paraboloid of revolution about a mirror axis;
  the mirror axis extends along the axis of rotational symmetry; and
  the EMR-reflective surface is configured to form, by reflection, the EMR flux that propagates along the mirror axis past the electrodes.

26. The device of claim 17, wherein:
  the region of the second electrode comprising the EMR-reflective multilayer film is configured as a concave reflective surface having a focal point situated adjacent the distal end of the first electrode where the EMR-producing plasma is located; and
  the concave reflective surface is situated to reflect EMR from the plasma axially past the first and second electrodes.

27. A microlithography apparatus, comprising:
  a device for generating an EMR flux as recited in claim 17;
  an illumination-optical system situated and configured to illuminate a reticle with an EMR flux produced by the device, the reticle defining a pattern to be transferred to a sensitive substrate; and
  a projection-optical system situated downstream of the illumination-optical system and configured to transfer the pattern from the reticle to the sensitive substrate.

28. A microelectronic-device manufacturing process, comprising:
  (a) preparing a substrate;
  (b) processing the substrate; and
  (c) assembling microelectronic devices formed on the substrate during steps (a) and (b), wherein step (b) comprises the steps of (i) applying a resist to the substrate; (ii) exposing the resist; and (iii) developing the resist; and step (ii) comprises providing a microlithography apparatus as recited in claim 26, and using the microlithography apparatus to expose the resist with the pattern defined on the reticle.

* * * * *

UNITED STATES PATENT AND TRADEMARK OFFICE
CERTIFICATE OF CORRECTION

PATENT NO. : 6,590,959 B2  
DATED : July 8, 2003  
INVENTOR(S) : Kandaka et al.

Page 1 of 1

It is certified that error appears in the above-identified patent and that said Letters Patent is hereby corrected as shown below:

<u>Column 11,</u>  
Line 42, delete "which an" insert -- which can --.

<u>Column 14,</u>  
Line 54, delete "claim 26" insert -- claim 27 --.

Signed and Sealed this

Eleventh Day of May, 2004

JON W. DUDAS  
*Acting Director of the United States Patent and Trademark Office*